United States Patent [19]
Minami

[11] Patent Number: 5,806,571
[45] Date of Patent: Sep. 15, 1998

[54] APPARATUS AND METHOD FOR FORMING THE EXTERNAL LEADS OF AN INTEGRATED CIRCUIT

[75] Inventor: Hironori Minami, Kumamoto, Japan

[73] Assignee: NEC Corporation, Tokyo, Japan

[21] Appl. No.: 910,008

[22] Filed: Aug. 12, 1997

[30] Foreign Application Priority Data

Aug. 16, 1996 [JP] Japan .................................. 8-216276

[51] Int. Cl.6 .................................................. B21F 45/00
[52] U.S. Cl. .......................................... 140/105; 140/147
[58] Field of Search ..................................... 140/105, 147

[56] References Cited

U.S. PATENT DOCUMENTS

| | | | |
|---|---|---|---|
| 4,907,628 | 3/1990 | Corey et al. ............................. | 140/105 |
| 5,078,186 | 1/1992 | Togashi et al. .......................... | 140/105 |
| 5,477,894 | 12/1995 | Wakabayashi et al. ................. | 140/147 |

Primary Examiner—Lowell A. Larson
Attorney, Agent, or Firm—Whitham, Curtis & Whitham

[57] ABSTRACT

An apparatus and method is provided for forming the external leads of an IC, wherein the coplanarity of the tips of the plurality of external leads after external lead formation can be improved even with an IC in which the resin portion is curved. The apparatus comprises a plurality of resin support projections which each support part of a resin portion from underneath, and a plurality of support pins respectively opposing the resin support projections, which each press on part of the resin portion from above.

13 Claims, 4 Drawing Sheets

APPARATUS AND METHOD FOR FORMING THE EXTERNAL LEADS OF AN INTEGRATED CIRCUIT

BACKGROUND OF THE INVENTION

1. Field of the Invention

The present invention relates to an apparatus and method for forming the external leads of an integrated circuit (IC), and in particular to an apparatus and method for use in IC assembly processes such as for QFP and SOP type ICs, for forming the external leads of the IC into a predetermined shape.

2. Description of the Related Art

Schematic diagrams of a currently employed external lead formation apparatus which comprises a metallic die for producing the IC leads are shown in FIGS. 5 and 6, with FIG. 5 showing the configuration prior to lead formation, and FIG. 6 showing the configuration during formation of the external leads.

With conventional lead formation metallic dies of this type, an IC 10 in which a plurality of external leads 6 protrude horizontally from a side face of a resin portion 4, is fed onto a bending die 3 which is accurately positioned using a die holder 1 and a die frame 2, as is shown in FIG. 5.

Next, as is shown in FIG. 6, a punch 16 which is suspended below a punch holder 13, a cam 7 which is used to activate the punch 16, and an upper metallic die which comprises an upper stopper 12 which accurately stops the punch holder 13 by contacting a lower stopper 11 of a lower metallic die, are lowered down under pressure. Then once the bases of the external leads 6 of the IC 10 have been clamped strongly between a lead clamp portion 75 of the cam 7 and a lead clamp portion 35 of the bending die 3, the punch 16 is activated by the cam 7 and pivots about a punch support pin 15, to thereby form the external leads 6.

With such conventional technology however, if when the leads are to be formed the resin portion 4 is curved as is shown in FIG. 7(A), then because the bases of the external leads 6 are clamped strongly during lead formation as described above, the leads are formed with the resin portion 4 in a non curved configuration. However, following completion of the lead formation and the subsequent release of the clamping pressure, the resin portion 4 returns to its prior curved state, and as shown in FIG. 7(B), the loci of the tips 6A of the plurality of external leads 6 form a curved line with the same curvature as the resin portion 4. Consequently, the tips 6A of the plurality of external leads 6 are no longer coplanar. Therefore, when the IC 10 is mounted on a circuit board 18, the tips 6A of some of the external leads 6 will not contact the circuit board 18.

SUMMARY OF THE INVENTION

An object of the present invention is therefore to provide an apparatus and method for forming the external leads of an IC, wherein even with an IC in which the resin portion is curved, the coplanarity of the tips of the plurality of external leads after external lead formation can be improved, and consequently the occurrence of poor connections between some of the external leads and the circuit board during mounting of the IC can be prevented.

A characteristic of the present invention is that the IC external lead formation apparatus for forming a plurality of external leads which protrude from a side face of a resin portion of an IC into a predetermined shape, comprises: a plurality of resin support projections which each support part of the resin portion from underneath, and a plurality of support pins respectively opposing the resin support projections, which each press on part of the resin portion from above. Here the resin support projections may be provided on a bending die.

Moreover, a lead support portion which supports from beneath the base of the external leads at the side of the resin portion, may be provided on the bending die. Furthermore, the support pins may be inserted inside holes provided in a cam so as to be slidable in the upward and downward directions. In this case, the support pins may be continuously biased in the downward direction by a spring provided inside the cam. Moreover, the IC for which the apparatus is suitable may be a QFP or SOP type IC.

Another characteristic of the present invention, is that the formation method for forming, in a predetermined shape, a plurality of external leads which protrude from a side face of a resin portion of an IC, is one wherein portions on a lower face of the resin portion are supported by a plurality of resin support projections, and portions on an upper face of the resin portion located directly above the lower face portions supported by the resin support projections, are respectively pressed by support pins, and in this condition, the external leads are formed by operation of a punch. Here, the force applied to the resin portion by the resin support projections and the support pins may be set so that the formation of the external leads occurs with the shape of the resin portion unchanged from that prior to mounting on top of the resin support projections. That is to say, if the shape of the resin portion prior to mounting on top of the resin support projections is curved, then the formation of the external leads can be carried out without changing the curve shape. Moreover, the IC for which the method is suitable may be a QFP or SOP type IC.

DESCRIPTION OF THE PREFERRED EMBODIMENTS

Next is a description of the preferred embodiments of the present invention, with reference to the drawings.

Figure 1A:
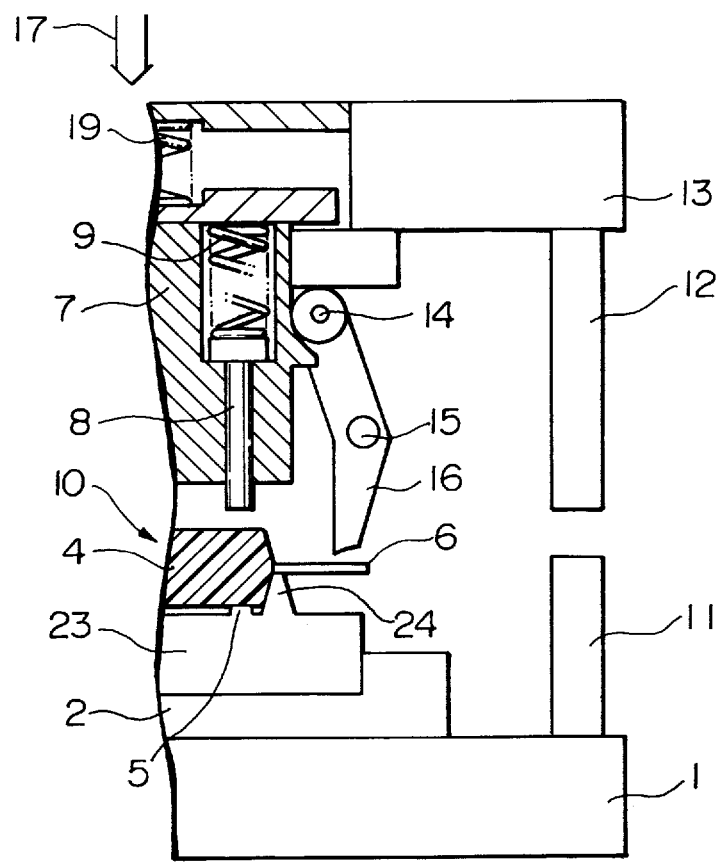
FIG. 1 is diagrams showing the configuration for an external lead formation apparatus and lead formation method of an embodiment of the present invention prior to the lead formation, (A) being a schematic diagram of the apparatus, and (B) being an enlarged view of one portion of (A).
Figure 1B:
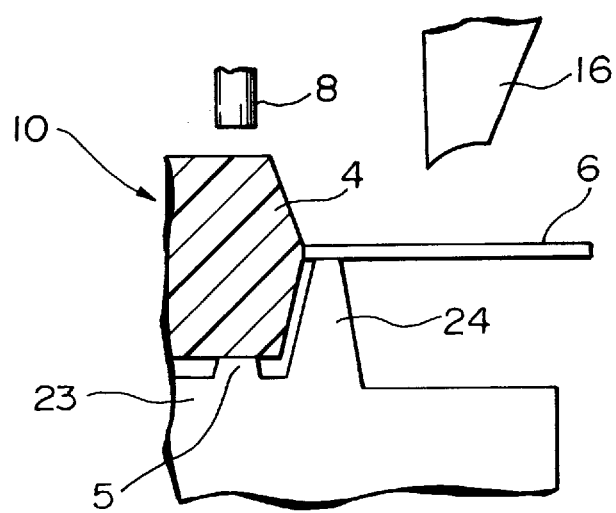

FIG. 1(A) is a schematic diagram showing a configuration for an external lead formation apparatus and lead formation method of an embodiment of the present invention, prior to external lead formation, while FIG. 1(B) shows an enlargement of one portion in FIG. 1(A).

With the apparatus shown in FIG. 1, a guide post (not shown in the drawings) which is attached to a die holder 1, and a guide bush which is provided in a punch holder 13 ensures accurate upward and downward movement of the punch holder 13. Moreover a lower stopper 11 and an upper stopper 12 ensure that the punch holder 13 is stopped precisely at the desired height.

A bending die 23 of the present invention is fixed accurately to the die holder 1 by means of a die frame 2, and has four lead support portions 24, as well as four resin support projections 5 arranged so as to be central on each of four sides of a resin portion 4, for supporting the four sided resin portion 4.

A cam 7 is positioned accurately on the punch holder 13 by means of a positioning block (not shown in the figures). The cam 7 is continually biased in the downward direction by means of a spring 19.

A support pin 8 of the invention is inserted inside a first hole provided in the cam 7, so as to be slidable in the upward and downward directions. Moreover a second hole which is larger than the first hole, is formed in an upper face of the cam 7, with a spring 9 positioned thereinside. The spring 9 continually biases the support pin 8 in the downward direction.

Bending punches 16 are each supported independently by a punch support pin 15. A back roller 14 is continually pressed against the cam 7 by means of a spring plunger or the like (not shown in the figures).

Only one resin support projection 5 and support pin 8 pair are shown in the figures. The apparatus however has respective support pins 8 positioned directly above each of the four resin support projections 5.

Next is a description of the operation.

First, a QFP or SOP type IC 10 having a plurality of external leads 6 protruding horizontally from the side face of the resin portion 4 is fed to the bending die 3 which is accurately positioned by means of the die holder 1 and the die frame 2, so that the resin portion 4 is supported by the resin support projections 5.

Figure 2:
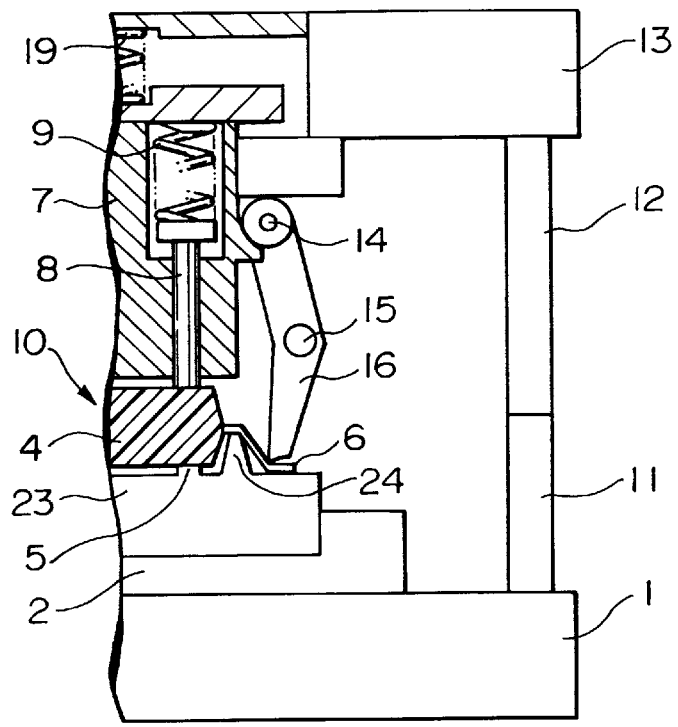
FIG. 2 is a schematic diagram showing the configuration for an external lead formation apparatus and lead formation method of an embodiment of the present invention during the lead formation process.
Figure 3:
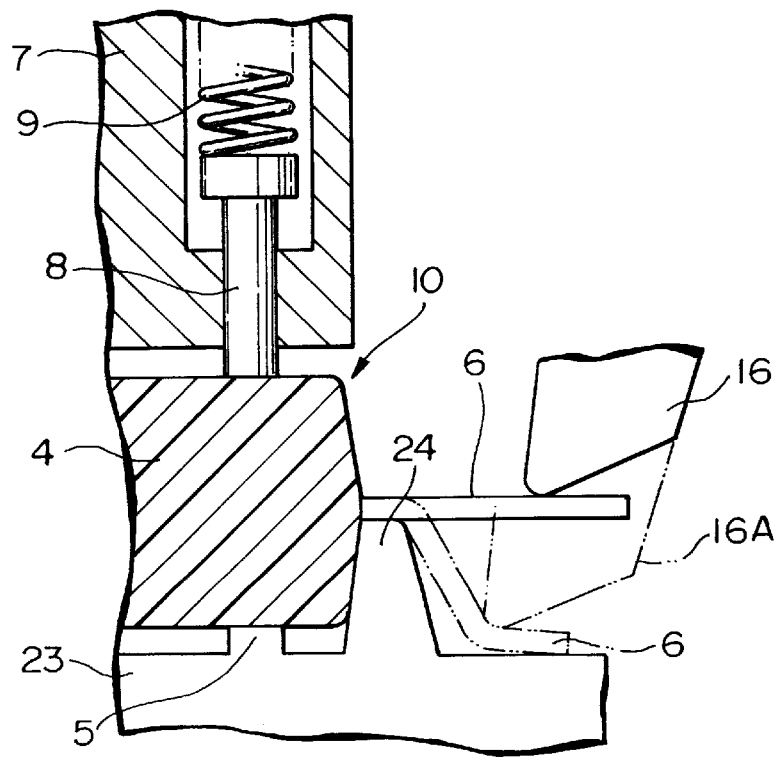
FIG. 3 is an enlarged diagram showing the configuration for an external lead formation apparatus and lead formation method of an embodiment of the present invention during the lead formation process.

Next, the punch holder 13 is lowered by a pressure 17, thereby forming the external leads as shown in FIG. 2 and FIG. 3. FIG. 3 shows an enlargement of one portion of FIG. 2.

At first, the resin portion 4 is clamped between the resin support projections 5 and the support pins 8. At this time since the pressure applied by the spring 19 and the springs 9 is appropriately adjusted, and each support pin 8 is pressed downwards by the four respective springs 9, then if the amount of curvature of the resin portion 4 is different along the four sides, the resin portion 4 can be clamped without any straightening of the curvature.

Furthermore, when the punch holder 13 is lowered to the height where the lower stopper 11 contacts the upper stopper 12, then as shown in FIG. 3, the punches 16 are lowered to the punch position 16A for lead formation, thereby completing the formation of the set of external leads.

Figure 4A:
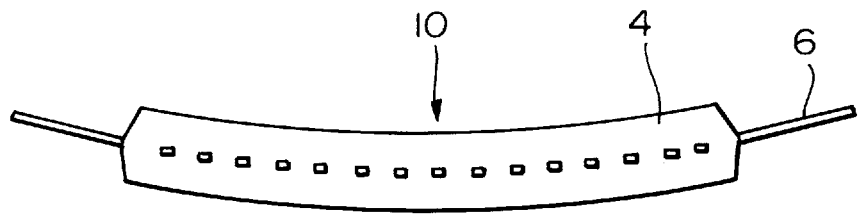
FIG. 4 is a diagram showing an IC for an embodiment of the present invention, where (A) is a side view prior to external lead formation, and (B) is a side view following external lead formation.
Figure 4B:
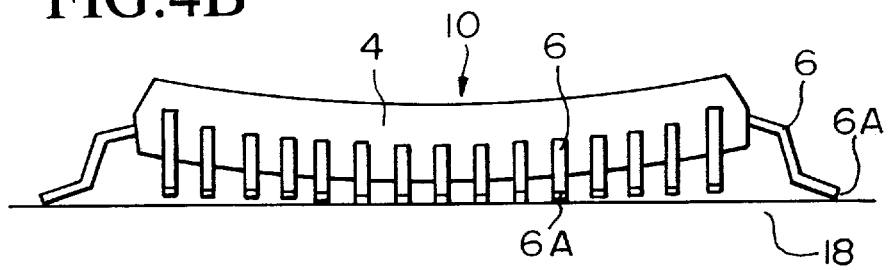

With this invention, in the case where the resin portion 4 at the time of lead formation has a curve as shown in FIG. 4(A), then since the curvature of the resin portion 4 is maintained during the lead formation process, the length of each external lead 6 is adjusted in relation to the curvature of the resin portion so that the tip 6A of each external lead 6 is positioned in a single plane. Therefore, on completion of the lead formation process, as shown in FIG. 4(B), the coplanarity of the tips 6A of the plurality of the external leads 6 of the IC 10 is excellent, and so when the IC is mounted onto a circuit board 18, the tips 6A of all the external leads 6 will make contact with the predetermined portions on the circuit board.

Furthermore, with the invention, since the predetermined lead formation operation can be completed in a single step, a greater effect can be realized without any lowering of productivity.

As explained above, the present invention enables external lead formation to be completed following clamping of the resin portion without any alteration in the curvature of the resin portion, and thus enables the formation of ICs in which the coplanarity of the external leads is excellent, even if the resin portion is curved.

What is claimed is:

1. An integrated circuit external lead formation apparatus for forming a plurality of external leads which protrude from a side face of a resin portion of an integrated circuit into a predetermined shape, characterized in comprising: a plurality of resin support projections which each support part of said resin portion from underneath, and a plurality of support pins respectively opposing said resin support projections, which each press on part of said resin portion from above.

2. An integrated circuit external lead formation apparatus according to claim 1, wherein the apparatus comprises a punch holder to which a cam and a punch to bend the leads are attached.

3. An integrated circuit external lead formation apparatus according to claim 1, wherein the apparatus further comprises an upper stopper mounted downward with said punch holder and a lower stopper mounted on the die holder, and wherein said upper punch holder and lower punch holder cooperatively ensures to stop said punch holder precisely at a predetermined position.

4. An integrated circuit external lead formation apparatus according to claim 1, wherein said resin support projections are provided on a bending die.

5. An integrated circuit external lead formation apparatus according to claim 4, wherein a lead support portion which supports from beneath the base of said external leads at the side of said resin portion is provided on said bending die.

6. An integrated circuit external lead formation apparatus according to claim 5, wherein said support pins are inserted inside apertures in a cam so as to be slidable in the upward and downward directions.

7. An integrated circuit external lead formation apparatus according to claim 6, wherein said support pins are continuously biased in the downward direction by a first spring provided inside said cam.

8. An integrated circuit external lead formation apparatus according to claim 7, wherein a punch holder is continuously biased in the downward direction by means of a second spring provided inside said punch holder, and the second spring biases said support pins in combination with said first spring.

9. An integrated circuit external lead formation apparatus according to claim 1, wherein said integrated circuit is a QFP or SOP type integrated circuit.

10. A formation method for forming, in a predetermined shape, a plurality of external leads which protrude from a side face of a resin portion of an integrated circuit, characterized in that portions on a lower face of said resin portion are supported by a plurality of resin support projections, and portions on an upper face of said resin portion located directly above the lower face portions supported by said resin support projections, are respectively pressed by support pins, and in this condition, said external leads are formed by operation of a punch.

11. A formation method according to claim 10, wherein a force applied to said resin portion by said resin support projections and said support pins is set so that the formation of said external leads occurs with the shape of said resin portion unchanged from that prior to mounting on top of said resin support projections.

12. A formation method according to claim 11, wherein the shape of said resin portion prior to mounting on top of said resin support projections is curved, and the formation of said external leads is carried out without changing the curve shape.

13. A formation method according to claim 10, wherein said integrated circuit is a QFP or a SOP type integrated circuit.

* * * * *

(12) REEXAMINATION CERTIFICATE (4243rd)
United States Patent
Minami

(10) Number: US 5,806,571 C1
(45) Certificate Issued: Jan. 2, 2001

(54) APPARATUS AND METHOD FOR FORMING THE EXTERNAL LEADS OF AN INTEGRATED CIRCUIT

(75) Inventor: Hironori Minami, Kumamoto (JP)

(73) Assignee: NEC Corporation, Tokyo (JP)

Reexamination Request:
No. 90/005,385, Jul. 7, 1999

Reexamination Certificate for:
Patent No.: 5,806,571
Issued: Sep. 15, 1998
Appl. No.: 08/910,008
Filed: Aug. 12, 1997

(30) Foreign Application Priority Data

Aug. 16, 1996 (JP) ................................ 8-216276

(51) Int. Cl.⁷ ........................................ B21F 45/00
(52) U.S. Cl. ............................... 140/105; 140/147
(58) Field of Search ........................... 140/105, 147

(56) References Cited

FOREIGN PATENT DOCUMENTS 6-244338  9/1994  (JP) .
7-321273  12/1995  (JP) .

*Primary Examiner*—Lowell A. Larson

(57) ABSTRACT

An apparatus and method is provided for forming the external leads of an IC, wherein the coplanarity of the tips of the plurality of external leads after external lead formation can be improved even with an IC in which the resin portion is curved. The apparatus comprises a plurality of resin support projections which each support part of a resin portion from underneath, and a plurality of support pins respectively opposing the resin support projections, which each press on part of the resin portion from above.

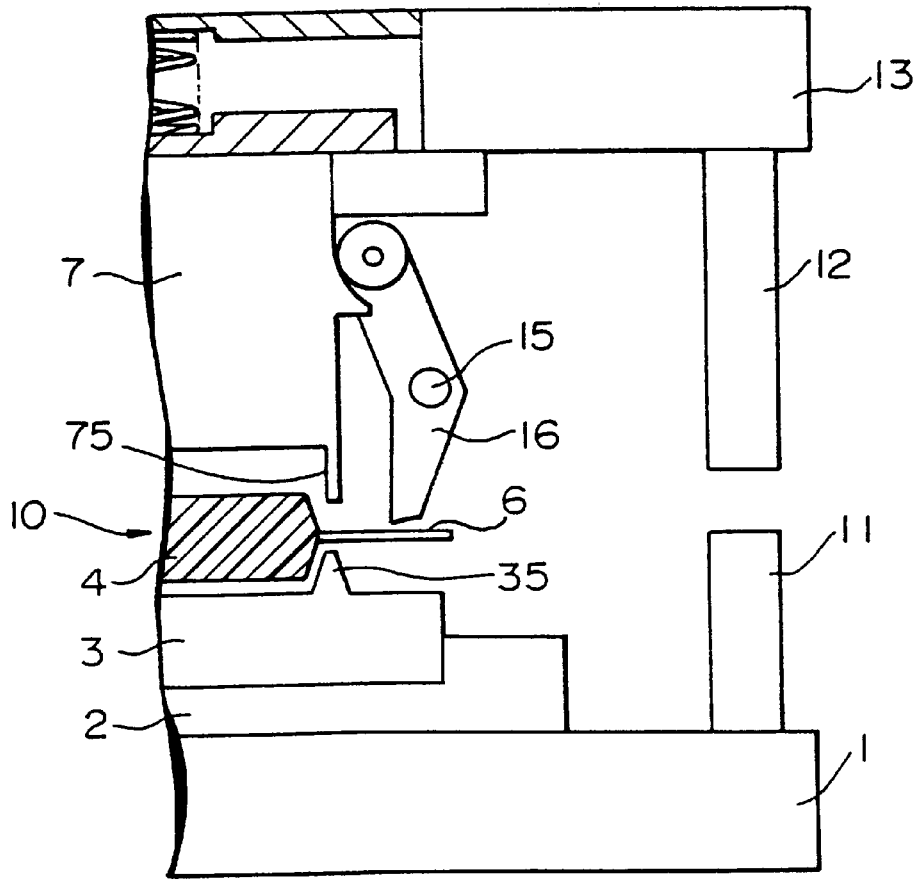

(AS AMENDED)

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 2, lines 39–44:

[FIG. 1 is] *FIGS. 1(A) and 1(B) are* diagrams showing the configuration for an external lead formation apparatus and lead formation method of an embodiment of the present invention prior to the lead formation, [(A) being] *where FIG. 1(A) is* a schematic diagram of the apparatus, and [(B) being] *FIG. 1(B) is* an enlarged view of one portion of [(A)] *FIG. 1(A)*.

Column 2, lines 53–56:

[FIG. 4 is a diagram] *FIGS. 4(A) and 4(B) are diagrams* showing an IC for an embodiment of the present invention, where [(A)] *FIG. 1(A)* is a side view prior to external lead formation, and [(B)] *FIG. 1(B)* is a side view following external lead formation.

Figure 7A:
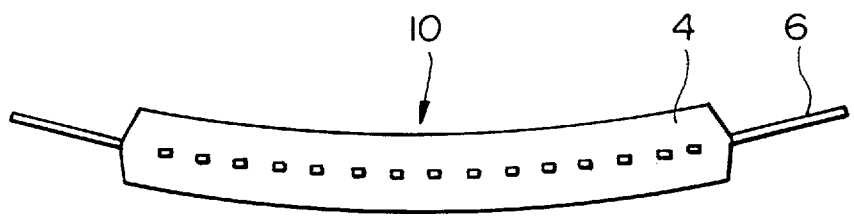
FIG. 7 is a diagram showing an IC made by current techniques, where (A) is a side view prior to external lead formation, and (B) is a side view following external lead formation.
Figure 7B:
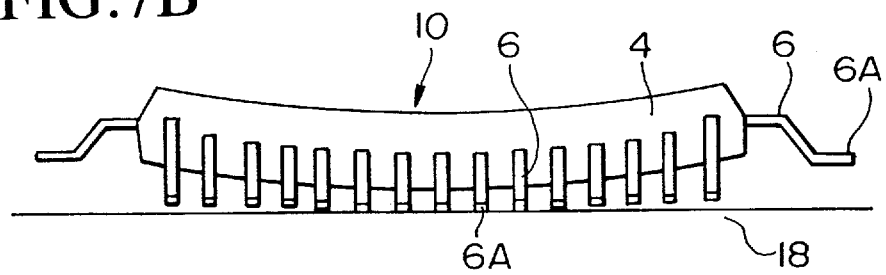

Column 2, lines 64–67:

[FIG. 7 is a diagram] *FIGS. 7(A) and 7(B) are diagrams* showing an IC made by current techniques, where [(A)] *FIG. 7(A)* is a side view prior to external lead formation, and [(B)] *FIG. 7(B)* is a side view following external lead formation.

Column 3, lines 11–17:

With the apparatus shown in [FIG. 1] *FIGS. 1(A) and 1(B)*, a guide post (not shown in the drawings) which is attached to a die holder 1, and a guide bush which is provided in a punch holder 13 ensures accurate upward and downward movement of the punch holder 13. Moreover, a lower stopper 11 and an upper stopper 12 ensure that the punch holder 13 is stopped precisely at the desired height.

Figure 5:
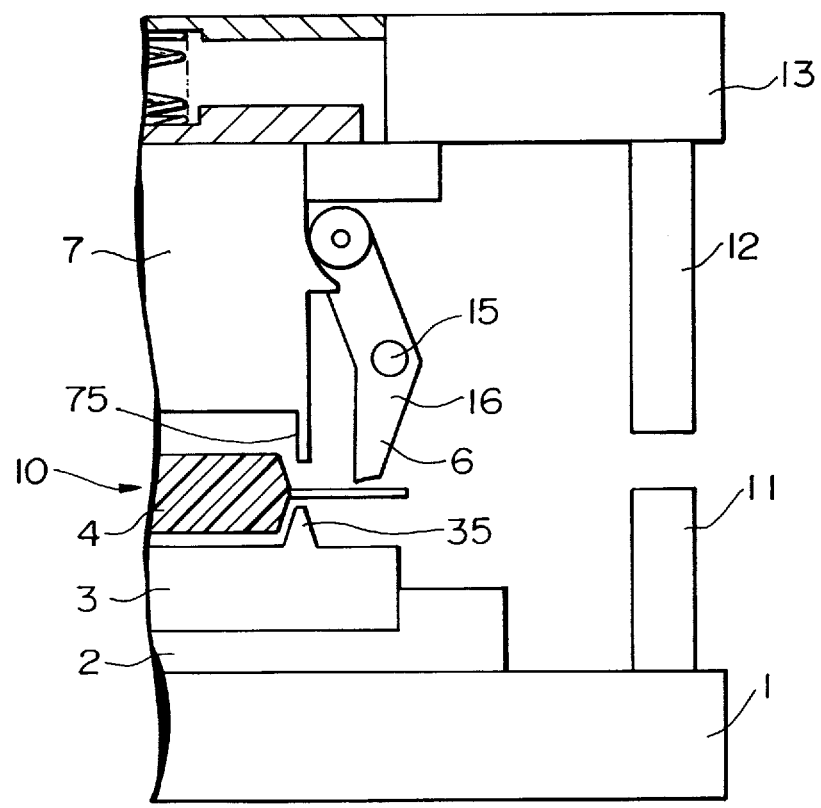
FIG. 5 is a schematic diagram showing the configuration of a currently employed external lead formation apparatus prior to lead formation.
Figure 6:
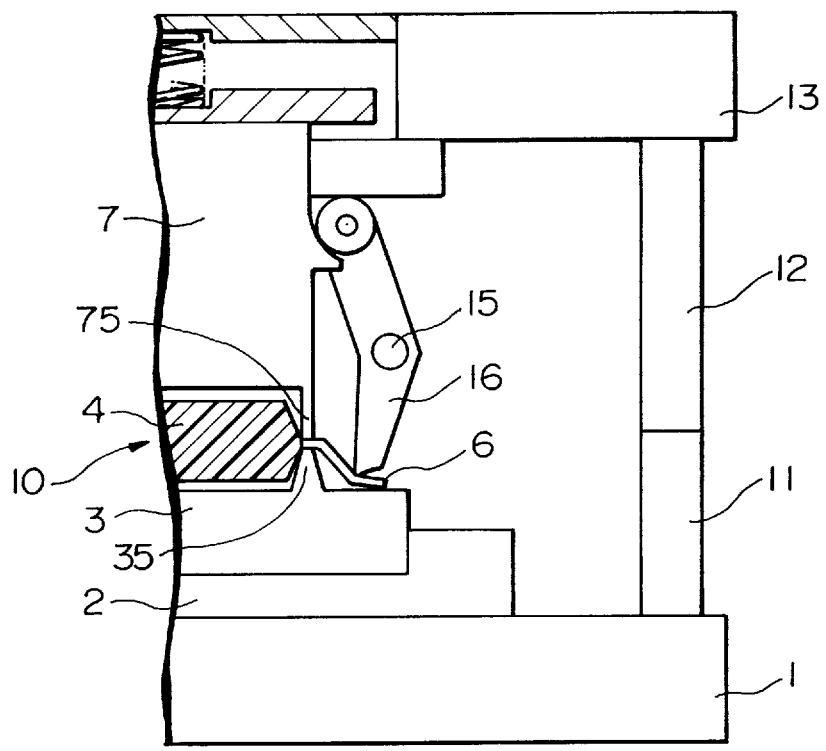
FIG. 6 is a schematic diagram showing the configuration of a currently employed external lead formation apparatus during lead formation.

THE DRAWING FIGURES HAVE BEEN CHANGED AS FOLLOWS:

FIG. 5 has been changed as follows: lead line #6 corrected.

AS A RESULT OF REEXAMINATION, IT HAS BEEN DETERMINED THAT:

Claim 8 is cancelled.

Claims 1, 2, 4, 6, 7 and 10 are determined to be patentable as amended.

Claims 3, 5, 9, 11, 12 and 13, dependent on an amended claim, are determined to be patentable.

1. An integrated circuit external lead formation apparatus for forming a plurality of external leads which protrude from a side face of a *rectangular* resin portion of an integrated circuit into a predetermined shape, [characterized in] comprising:

a punch holder and a die holder;

a cam continuously biased in the downward direction by means a first spring associated with said punch holder;

[a plurality of] *four* resin support projections [which each support part of said resin portion from underneath, and a plurality of] *provided on said die holder so that each of the four resin support projections support a center portion on each of four sides of said resin portion from underneath;*

*four* support pins respectively [opposing] *provided so as to oppose each of* said *four* resin support projections, [which each press on part of said resin portion from above] *said four support pins being respectively biased in the downward direction by means of a second springs associated with said cam,*

*wherein when said punch holder and said die holder approach each other, each corresponding pair of said four resin support projections and said four support pins clamps said center portion on each of four sides of said resin portion, while the clamping forces by said four resin support projections and said four support pins are controlled by said first and second springs and said cam is positioned at a position determined by the forces of said first and second springs.*

2. An integrated circuit external lead formation apparatus according to claim 1, wherein [the apparatus comprises a punch holder to which a cam and] a punch to bend the leads [are] *is* attached *to said punch holder*.

4. An integrated circuit external lead formation apparatus according to claim 1, wherein said *four* resin support projections are provided on a bending die *provided on said die holder*.

6. An integrated circuit external lead formation apparatus according to claim 5, wherein said *four* support pins are inserted inside apertures in [a] *said* cam so as to be slidable in the upward and downward directions.

7. An integrated circuit external lead formation apparatus according to claim 6, wherein said [support pins are continuously biased in the downward direction by a] first spring*s are* provided inside said cam.

10. A formation method for forming, in a predetermined shape, a plurality of external leads which protrude from a side face of a resin portion of an integrated circuit, [characterized in that portions on a lower face of said resin portion are supported by a plurality of resin support projections, and portions on an upper face of said resin portion located directly above the lower face portions supported by said resin support projections, are respectively pressed by support pins, and in this condition, said external leads are formed by operation of a punch] *comprising:*

*providing an apparatus which comprises:*

*a punch holder and a die holder;*

*a cam continuously biased in the downward direction by means of a first spring associated with said punch holder;*

*four resin support projections provided on said die holder so that each of said four support projection supports a center portion on each of four sides of said resin portion from underneath; and*

*four support pins respectively provided so as to oppose each of said four resin support projections, wherein said four support pins are respectively biased in the downward direction by means of second springs associated with said cam;* making said punch holder and said die holder approach each other;

clamping each center portion on each of four sides of said resin portion by each corresponding pair of said four resin support projections and said four support pins while controlling the clamping forces of said resin support projection and said four support pins by said first and second springs; and positioning said cam at a position determined by the forces of said first and second springs.

\* \* \* \* \*